United States Patent
Kim et al.

(10) Patent No.: US 9,129,998 B2
(45) Date of Patent: Sep. 8, 2015

(54) APPARATUS FOR CLEANING AN OBJECT AND METHOD OF OPERATING THE SAME

(75) Inventors: Gwang-Sick Kim, Cheonan-si (KR); Seung-Geun Kim, Asan-si (KR); Sung-Soo Lee, Asan-si (KR); Jae-Nam Lee, Asan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 640 days.

(21) Appl. No.: 13/438,327

(22) Filed: Apr. 3, 2012

(65) Prior Publication Data

US 2012/0260945 A1    Oct. 18, 2012

(30) Foreign Application Priority Data

Apr. 12, 2011   (KR) .................. 10-2011-0033739

(51) Int. Cl.
*A47L 15/00* (2006.01)
*A47L 5/00* (2006.01)
*A47L 9/00* (2006.01)
*H01L 21/67* (2006.01)
*H01L 21/02* (2006.01)
*H01L 21/56* (2006.01)

(52) U.S. Cl.
CPC .... *H01L 21/67017* (2013.01); *H01L 21/02041* (2013.01); *H01L 21/02046* (2013.01); *H01L 21/67028* (2013.01); *H01L 21/67051* (2013.01); H01L 21/56 (2013.01); H01L 2924/0002 (2013.01)

(58) Field of Classification Search
CPC ................. H01L 21/02041; H01L 21/02046; H01L 21/02049; H01L 21/02054; H01L 21/67017; H01L 21/67028; H01L 21/27051
USPC .............. 15/301, 302, 303, 306.1, 318, 345
See application file for complete search history.

(56) References Cited

U.S. PATENT DOCUMENTS

| | | | | |
|---|---|---|---|---|
| 5,806,138 A * | 9/1998 | Kawasaki | ....................... | 15/303 |
| 5,862,823 A * | 1/1999 | Kamikawa et al. | ........... | 134/182 |
| 6,321,760 B1 * | 11/2001 | Meissner | ........................ | 134/80 |
| 6,638,366 B2 * | 10/2003 | Lammert et al. | ................ | 134/33 |
| 6,871,655 B2 * | 3/2005 | Davis et al. | ..................... | 134/78 |
| 2015/0020343 A1 * | 1/2015 | Shibata et al. | ............... | 15/306.1 |

FOREIGN PATENT DOCUMENTS

| | | |
|---|---|---|
| JP | 10-034094 | 2/1998 |
| KR | 1020030003946 | 1/2003 |
| KR | 1020050074911 | 7/2005 |
| KR | 100656249 | 12/2006 |

* cited by examiner

*Primary Examiner* — Bryan R Muller
(74) *Attorney, Agent, or Firm* — F. Chau & Associates, LLC

(57) ABSTRACT

An apparatus for cleaning at least one object may include a cleaning chamber, an air-blowing unit, a rotating unit and a collecting unit. The at least one object may be received within the cleaning chamber. The air-blowing unit may be configured to blow air to the at least one object in the cleaning chamber to float particles from the at least one object. The rotating unit may be configured to rotate the at least one object to provide the at least one object with the air in at least two directions from the air-blowing unit. The collecting unit may be configured to collect the floated particles.

13 Claims, 7 Drawing Sheets

APPARATUS FOR CLEANING AN OBJECT AND METHOD OF OPERATING THE SAME

CROSS-RELATED APPLICATION

This application claims priority under 35 USC §119 to Korean Patent Application No. 10-2011-0033739, filed on Apr. 12, 2011, the disclosure of which is hereby incorporated by reference herein in its entirety.

BACKGROUND

1. Technical Field

Example embodiments relate to an apparatus for cleaning an object and to a method of operating the same. More particularly, example embodiments relate to an apparatus for removing particles on a semiconductor package and to a method of operating the same.

2. Description of the Related Art

Generally, a plurality of semiconductor fabrication processes may be performed on a semiconductor substrate to form semiconductor chips. To mount the semiconductor chips on a printed circuit board (PCB), a packaging process may be performed on the semiconductor chips to form semiconductor packages.

The packaging process may include, for example, an attaching process for attaching the semiconductor chip to a package substrate, a wire bonding process for electrically connecting the semiconductor chip with the package substrate, a molding process for covering the package substrate and the semiconductor chip with an epoxy molding compound (EMC), and a mounting process for mounting external terminals on the package substrate, etc.

During the performing of the processes, particles may cling on the semiconductor package. The particles may in turn cause failures in connection with the semiconductor package. For example, the particles may block an electrical connection between the external terminals and the package substrate. Further, after the molding process, the EMC may cling on the molding member. When the molding member is cured, the EMC on the molding member may firmly adhere to a surface of the molding member. When an identification mark is engraved on the molding member using a laser, the EMC on the molding member may be detached. The identification mark may not be accurately engraved.

According to related arts, a worker may directly blow air to the semiconductor package to remove the particles from the semiconductor package. However, the manually removing process may have a low particle removal efficiency. Further, because the manually removing process may be individually performed on each of the semiconductor packages, the worker may have to bear difficult burdens.

A related automatic cleaning apparatus may include a nozzle configured to blow air to a magazine, which may be configured to receive the semiconductor packages, in one direction. The particle removal efficiency may be increased in proportion to a high air pressure. However, as a thickness of the package substrate may become thinner when the high pressurized air is blown to the thin package substrate, the thin package substrate may get out of the magazine. Therefore, as a result the ability to increase the air pressure may be limited in connection with the above-mentioned cleaning apparatus.

SUMMARY

Example embodiments provide an apparatus for cleaning an object that may be capable of effectively removing particles on a semiconductor package using an air having a proper pressure for preventing the semiconductor package from being left from a magazine.

According to an example embodiments, there is provided an apparatus for cleaning at least one object. The apparatus may include a cleaning chamber, an air-blowing unit, a rotating unit and a collecting unit. The at least one object may be received within the cleaning chamber. The air-blowing unit may be configured to blow air to the at least one object in the cleaning chamber to float particles from the at least one object. The rotating unit may be configured to rotate the at least one object to provide the at least one object with the air in at least two directions from the air-blowing unit. The collecting unit may be configured to collect the floated particles.

In an example embodiment, the air-blowing unit may include an air-blowing frame disposed adjacent to the cleaning chamber, a nozzle assembly disposed in the air-blowing frame and configured to blow the air to the object, and a vertical actuator installed at the air-blowing frame and connected to the nozzle assembly. The vertical actuator is configured to lift the nozzle assembly. The nozzle assembly may include a nozzle block fixed to the vertical actuator, and a nozzle installed at the nozzle block and configured to blow the air. The nozzle may include a pair of nozzles vertically arranged. The air-blowing unit may further include a first horizontal actuator configured to move the air-blowing frame forwardly and backwardly toward and away from the cleaning chamber.

In an example embodiment, the rotating unit may include a stage configured to receive the at least one object, and a rotary actuator connected to the stage to rotate the stage. The rotary actuator may rotate the stage by about 180° to provide opposing side surfaces of the at least one object with the air.

In an example embodiment, the collecting unit may include a collecting frame arranged adjacent to the cleaning chamber, an exhausting duct installed in the collecting frame and connected to the cleaning chamber, and a vacuum pump configured to provide a vacuum to the cleaning chamber through the exhausting duct to suck the particles through the exhausting duct. The collecting unit may further include a second horizontal actuator configured to move the collecting frame forwardly and backwardly toward and away from the cleaning chamber.

In an example embodiment, the air-blowing unit, the cleaning chamber and the collecting unit may be serially arranged.

In an example embodiment, the apparatus may further include a conveyor configured to load the at least one object into the cleaning chamber.

In an example embodiment, the apparatus may further include a clamp installed at the cleaning chamber to fix the at least one object within the cleaning chamber.

In an example embodiment, the apparatus may further include a stopper installed at the cleaning chamber and configured to restrict movement of the at least one object.

According to an example embodiment, there is provided an apparatus for cleaning semiconductor packages. The apparatus may include a cleaning chamber configured to receive therein a magazine in which semiconductor packages are received, a conveyor, a clamp, a stopper, an air-blowing unit, a rotating unit and a collecting unit. The conveyor may be connected to the cleaning chamber to load the magazine into the cleaning chamber. The clamp may be installed at the cleaning chamber to fix the magazine within the cleaning chamber. The stopper may be installed at the cleaning chamber to restrict movement of the magazine. The air-blowing unit may be configured to blow air into the magazine to float particles from the semiconductor packages. The rotating unit may be configured to rotate the magazine to provide opposing sides of each of the semiconductor packages with the air from the air-blowing unit. The collecting unit may be configured to collect the floated particles.

In an example embodiment, the air-blowing unit may include an air-blowing frame disposed adjacent to the cleaning chamber, a nozzle assembly disposed in the air-blowing frame and configured to blow the air into the magazine, a vertical actuator installed at an upper surface of the air-blowing frame and connected to the nozzle assembly and configured to lift the nozzle assembly, and a first horizontal actuator configured to move the air-blowing frame forwardly and backwardly toward and away from the cleaning chamber.

In an example embodiment, the rotating unit may include a stage configured to receive the magazine thereon, and a rotary actuator connected with the stage and configured to rotate the stage.

In an example embodiment, the collecting unit may include a collecting frame disposed adjacent to the cleaning chamber, an exhausting duct installed in the collecting frame and connected to the cleaning chamber, a vacuum pump configured to provide a vacuum to the cleaning chamber through the exhausting duct to suck the particles through the exhausting duct, and a second horizontal actuator configured to move the collecting frame forwardly and backwardly toward and away from the cleaning chamber.

According to an example embodiment, a method for operating an apparatus to clean at least one object is provided. The method includes loading the at least one object into a holding device within a cleaning chamber, rotating the holding device having the at least one object therein at an angle of about 90 degrees such that a first side of the holding device is oriented toward to an air blowing unit disposed on a side of the cleaning chamber, positioning the air blowing unit adjacent to the first side of the holding device, connecting the collecting unit with the cleaning chamber, providing the cleaning chamber with a vacuum through the collecting unit, and performing a first blowing process which includes blowing air toward the first side of the holding device from the air blowing unit to float particles from a first portion of the at least one object. The floated particles from the first portion of the at least one object are sucked into the collecting unit by the vacuum. The method further includes moving the collecting unit and the air blowing unit backwardly away from the cleaning chamber, rotating the holding device at an angle of about 180 degrees such that a second side of the holding device opposite to the first side of the holding device is oriented toward the air blowing unit, positioning the air blowing unit adjacent to the second side of the holding device, connecting the collecting unit with the cleaning chamber, providing the cleaning chamber with a vacuum through the collecting unit, and performing a second blowing process which includes blowing air toward the second side of the holding device from the air blowing unit to float particles from a second portion of the at least one object and the floated particles from the second portion of the at least one object are sucked into the collecting unit by the vacuum and unloading the holding device from the cleaning chamber after the floated particles from the second portion of the at least one object are sucked into the collecting unit by the vacuum.

According to an example embodiment, the rotating unit may rotate the semiconductor packages by about 180°, so that the air may be blown to the both side surfaces of the semiconductor package. Thus, the air may have a proper pressure for preventing the semiconductor package from being damaged. As a result, the particles may be effectively removed from the semiconductor packages without damaging the semiconductor packages.

BRIEF DESCRIPTION OF THE DRAWINGS

Example embodiments can be understood in more detail from the following detailed description taken in conjunction with the accompanying drawings.

FIG. 1 is a cross-sectional view illustrating an apparatus for cleaning an object in accordance with an example embodiment; and FIGS. 2 to 7 are cross-sectional views illustrating operations of the apparatus in FIG. 1.

DETAILED DESCRIPTION OF EXAMPLE EMBODIMENTS

Figure 1:
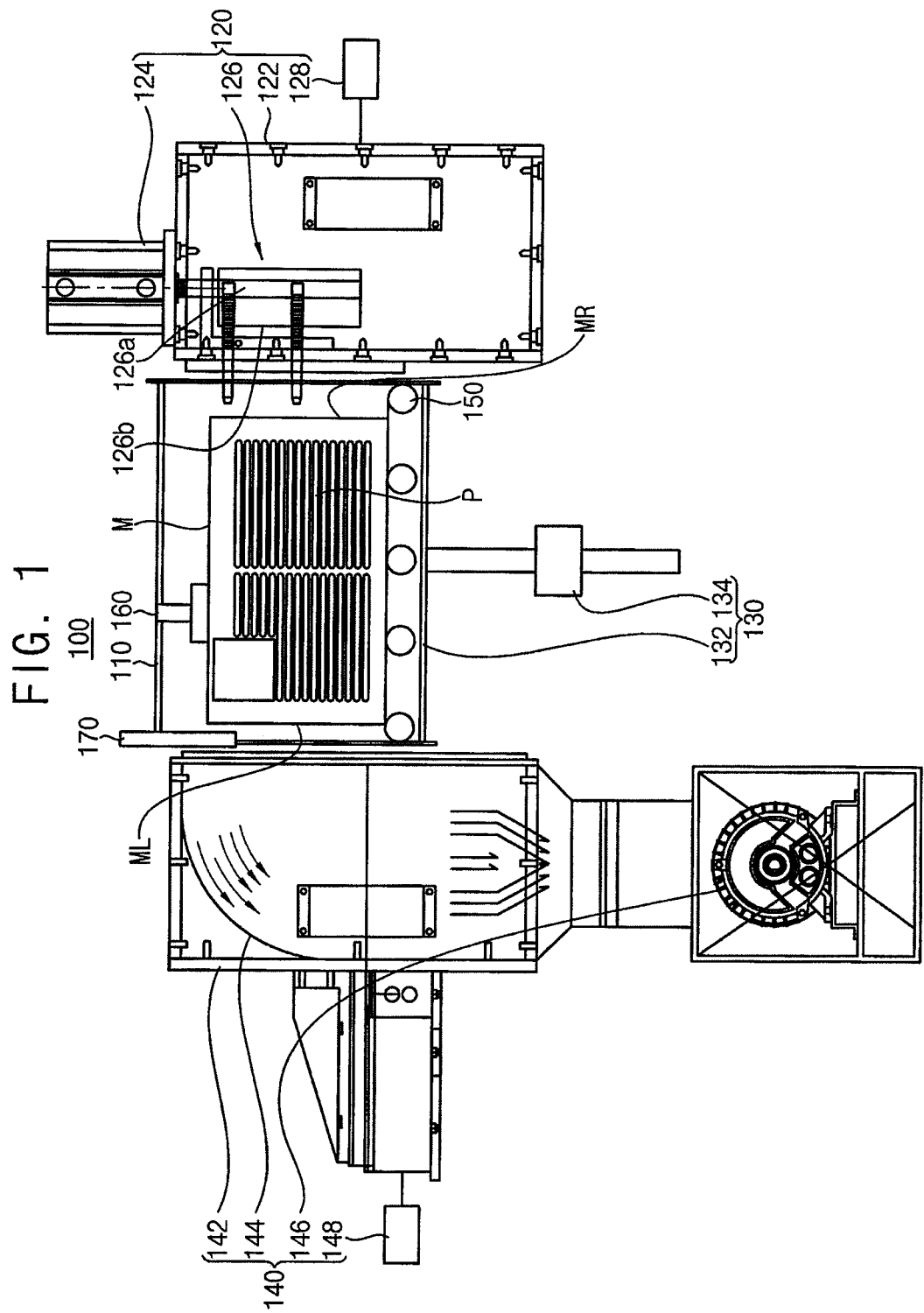
FIGS. 1 to 7 represent non-limiting, example embodiments as described herein.

Example embodiments will be described more fully hereinafter with reference to the accompanying drawings, in which example embodiments are shown. The present invention may, however, be embodied in many different forms and should not be construed as being limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout. As used herein, the term "and/or" includes any and all combinations of one or more of the associated listed items.

As used herein, the singular forms "a," "an" and "the" are intended to include the plural forms as well, unless the context clearly indicates otherwise.

Hereinafter, example embodiments will be explained in detail with reference to the accompanying drawings.

FIG. 1 is a cross-sectional view illustrating an apparatus for cleaning an object in accordance with an example embodiment.

Referring to FIG. 1, an apparatus 100 for cleaning an object in accordance with this example embodiment may include, for example, a cleaning chamber 110, an air-blowing unit 120, a rotating unit 130 and a collecting unit 140.

In an example embodiment, the air-blowing unit 120, the cleaning chamber 110 and the collecting unit 140 may be, for example, serially arranged. The air-blowing unit 120 may be positioned at, for example, a right side of the cleaning chamber 110. The collecting unit 140 may be located at, for example, a left side of the cleaning chamber 110. The rotating unit 130 may be arranged, for example, under the cleaning chamber 110.

A plurality of objects may be loaded into the cleaning chamber 110. In an example embodiment, the objects may include, for example, semiconductor packages P. The semiconductor packages P may be, for example, received in a magazine M. The magazine M may have, for example, horizontal slots. The semiconductor packages P may be horizontally received in slots. The magazine M may have a right surface MR and a left surface ML. The magazine M may be loaded into the front of the cleaning chamber 110.

The air-blowing unit 120 may include, for example, an air-blowing frame 122, a vertical actuator 124, a nozzle assembly 126 and a first horizontal actuator 128.

The air-blowing frame 122 may arranged, for example, at the right side of the cleaning chamber 110. The first horizontal actuator 128 may move the air-blowing frame 122 forwardly and backwardly toward and away from the cleaning chamber 110. In an example embodiment, the first horizontal actuator 128 may include, for example, a cylinder. The vertical actuator 124 may be installed at, for example, an upper surface of the air-blowing frame 122. The vertical actuator 124 may include, for example, a cylinder.

The nozzle assembly 126 may be disposed in the air-blowing frame 122 and may include, for example, a nozzle block 126a and a nozzle 126b. The nozzle block 126a may be fixed to the vertical actuator 124. Thus, the nozzle block 126a may be lifted by the vertical actuator 124. The nozzle 126b may be horizontally fixed to the nozzle block 126a. The nozzle 126b may blow air into the magazine M to float particles from the semiconductor packages P. In an example embodiments, the nozzle 126b may include, for example, two nozzles vertically arranged in the air-blowing frame 122. Alternatively, numbers and gaps between the nozzles 126b may vary in accordance with kinds of the object.

The rotating unit 130 may include, for example, a stage 132 and a rotary actuator 134. The magazine M may be placed, for example, on an upper surface of the stage 132. The rotary actuator 134 may be connected to, for example, a lower surface of the stage 132. The rotary actuator 134 may rotate the stage 132. In an example embodiment, the rotary actuator 134 may rotate the stage 132 by, for example, about 180°. The rotary actuator 134 may include, for example, a cylinder.

In an example embodiment, when the right side of the magazine M may be oriented toward the nozzle 126b, the air may be blown to the right side of the magazine M from nozzle 126b to float the particles on right portions of the semiconductor packages P. After floating the particles from the right portions of the semiconductor packages P, the rotary actuator 134 may rotate the stage 132 at an angle of, for example, about 180° to orient the left side of the magazine M toward the nozzle 126b. The air may be blown to the left side of the magazine M from the nozzle 126b to float particles from left portions of the semiconductor packages P.

Therefore, the right portions and the left portions of the semiconductor packages P may be individually cleaned, so that most of the particles may be floated from the semiconductor packages p without an increase in the air pressure.

The collecting unit 140 may include, for example, a collecting frame 142, an exhausting duct 144, a vacuum pump 146 and a second horizontal actuator 148.

The collecting frame 142 may be located at, for example, the right side of the cleaning chamber 110. The second horizontal actuator 148 may move the collecting frame 142 forwardly and backwardly toward and away from the cleaning chamber 110. In an example embodiment, the second horizontal actuator 148 may include, for example, a cylinder.

The exhausting duct 144 may be installed at the collecting frame 142. The exhausting duct 144 may be selectively connected to the cleaning chamber 110. The vacuum pump 146 may provide the exhausting duct 144 with a vacuum. The particles floated by the air-blowing unit 120 may be sucked through the exhausting duct 144.

Additionally, the magazine M may be loaded into the cleaning chamber 110 along, for example, a conveyor 150. The conveyor 150 may be arranged on the stage 132 of the rotating unit 130. Thus, the rotating unit 130 may rotate the conveyor 150 and the magazine M together with each other.

A clamp 160 may be installed at, for example, a ceiling of the cleaning chamber 110. The clamp 160 may press an upper surface of the magazine M to firmly fix the magazine M within the cleaning chamber 110. When the rotating unit 130 rotates the magazine M, the clamp 160 may not fix the magazine M. The clamp 160 may fix the magazine M only during the air blowing processes performed by the air-blowing unit 120 to float the particles from the semiconductor packages P.

In addition, for example, a stopper 170 may be installed at an inner wall of the cleaning chamber 110. The stopper 170 may restrict movement of the magazine M in the cleaning chamber 110 to accurately provide the magazine M with the air.

FIGS. 2 to 7 are cross-sectional views illustrating operations of the apparatus in FIG. 1.

Figure 2:
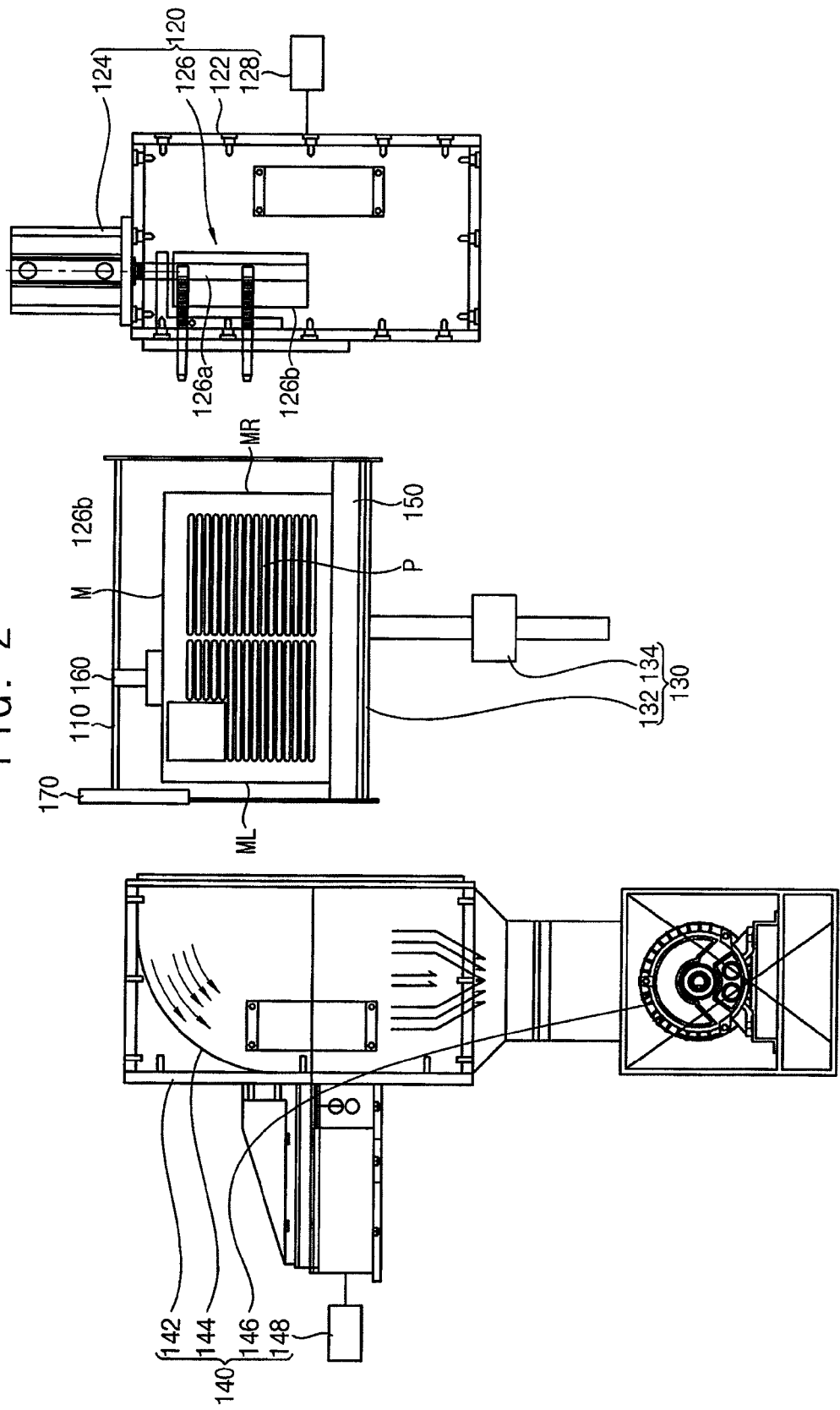

Referring to FIG. 2, the first horizontal actuator 128 and the second horizontal actuator 148 may move the air-blowing frame 122 and the collecting frame 142, backwardly respectively, from the cleaning chamber 110. The magazine M in which the semiconductor packages P may be received may be loaded into the front of the cleaning chamber 110 along the conveyor 150.

Figure 3:
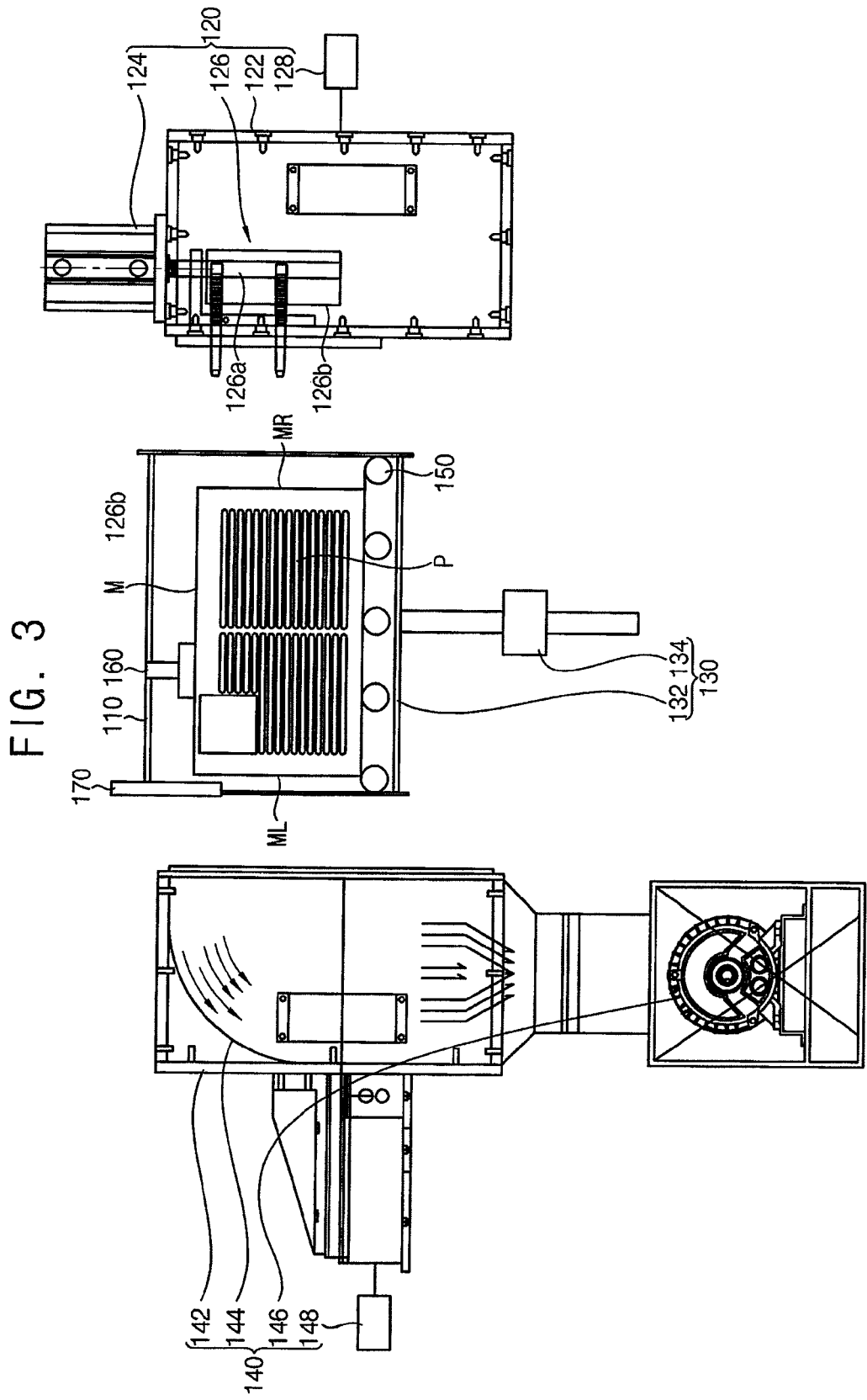

Referring to FIG. 3, the rotating unit 130 may rotate the magazine M at an angle of, for example, about 90°. Thus, the right side MR of the magazine M may be oriented toward the air-blowing unit 120.

Figure 4:
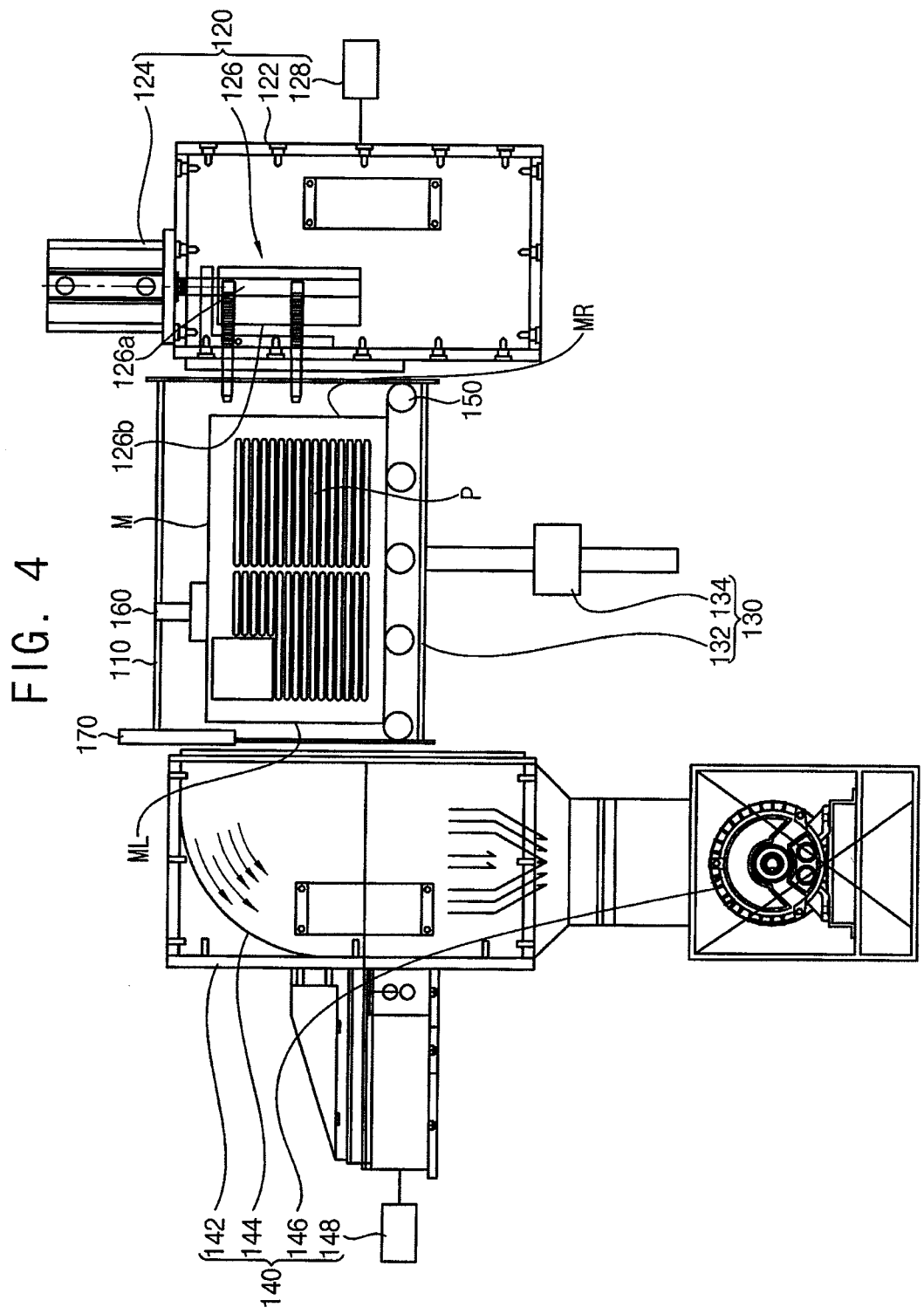

Referring to FIG. 4, the first horizontal actuator 128 may move the air-blowing frame 122 forwardly toward the cleaning chamber 110. The vertical actuator 124 may lower the nozzle assembly 126. The nozzle 126b may be positioned adjacent to the right side MR of the magazine M.

The second horizontal actuator 148 may move the collecting frame 142 forwardly toward the cleaning chamber 110 to connect the exhausting duct 144 with the left surface of the cleaning chamber 110. The vacuum pump 146 may provide the cleaning chamber 110 with the vacuum through the exhausting duct 144.

The clamp 160 may press the upper surface of the magazine M to firmly fix the magazine M within the cleaning chamber 110. The nozzle 126b may blow the air toward the right side MR of the magazine M to float the particles from the right portions of the semiconductor packages P. The floated particles may be sucked through the exhausting duct 144 by the vacuum.

Figure 5:
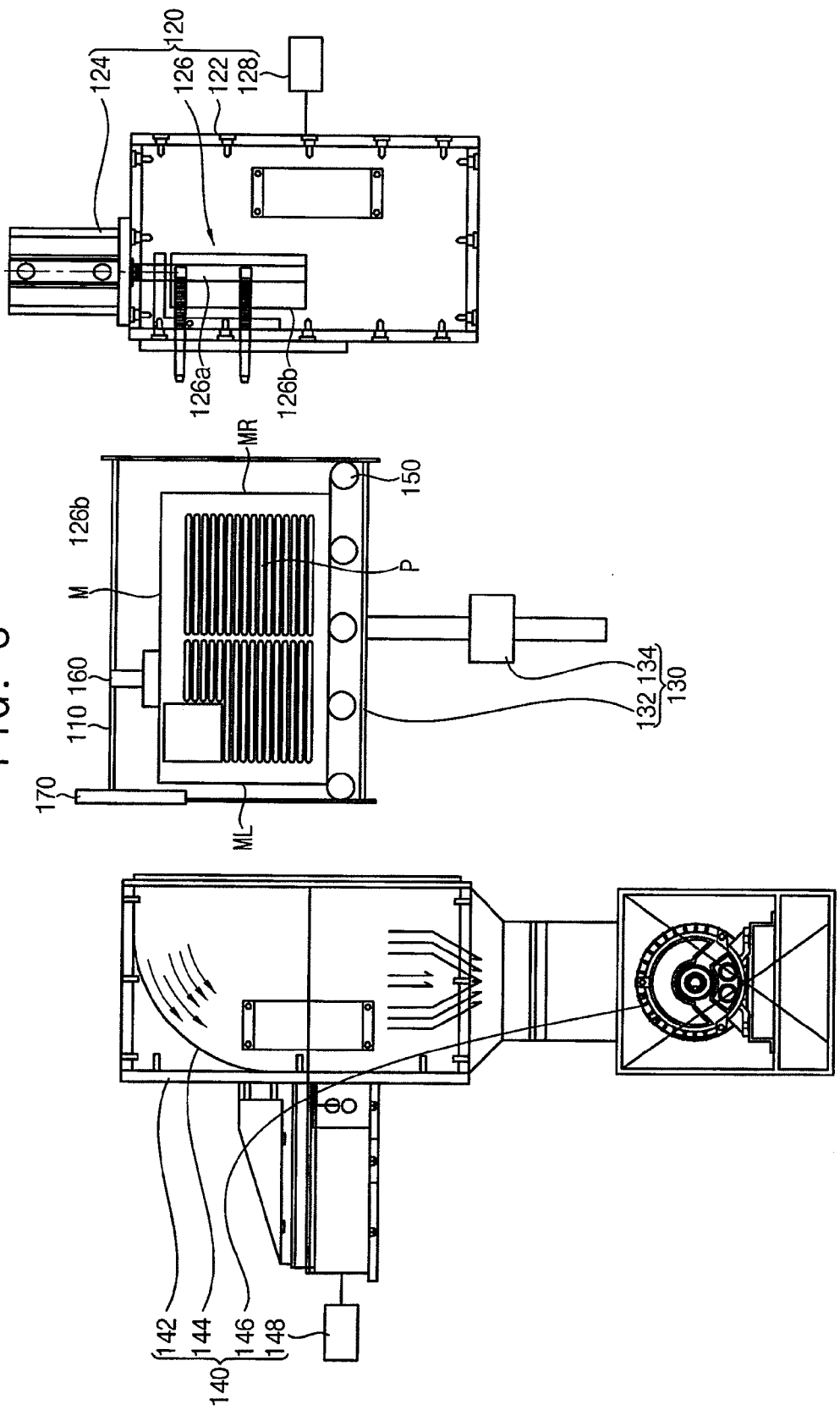

Referring to FIG. 5, after removing the particles from the right portions of the semiconductor packages P, the clamp 160 may be raised. The first horizontal actuator 128 may move the air-blowing unit 120 backwardly from the cleaning chamber 110. The second horizontal actuator 148 may move the collecting unit 140 backwardly from the cleaning chamber 110.

Figure 6:
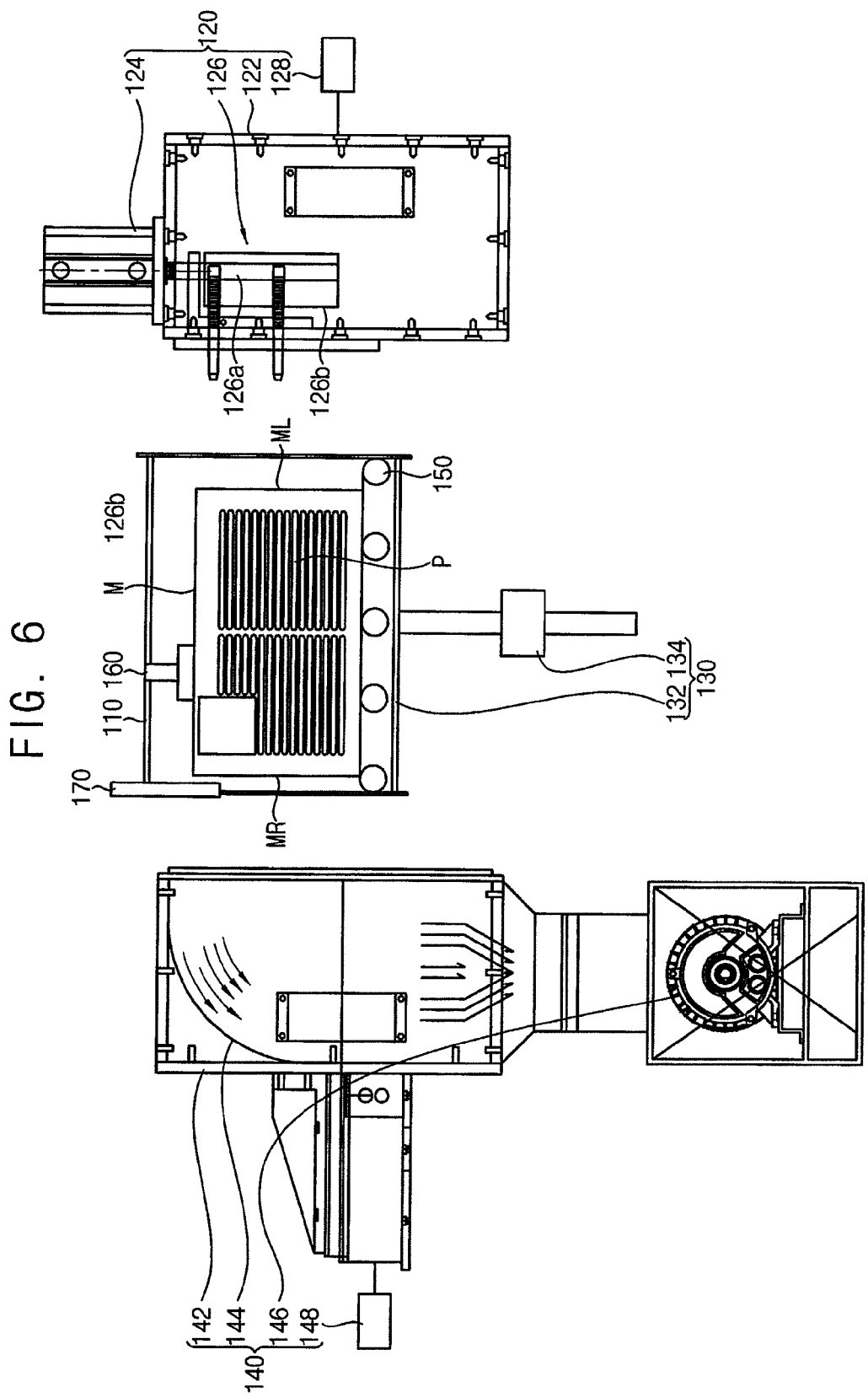

Referring to FIG. 6, the rotating unit 130 may rotate the magazine M at an angle of, for example, about 180°. Thus, the left side ML of the magazine M may be oriented toward the air-blowing unit 120.

Figure 7:
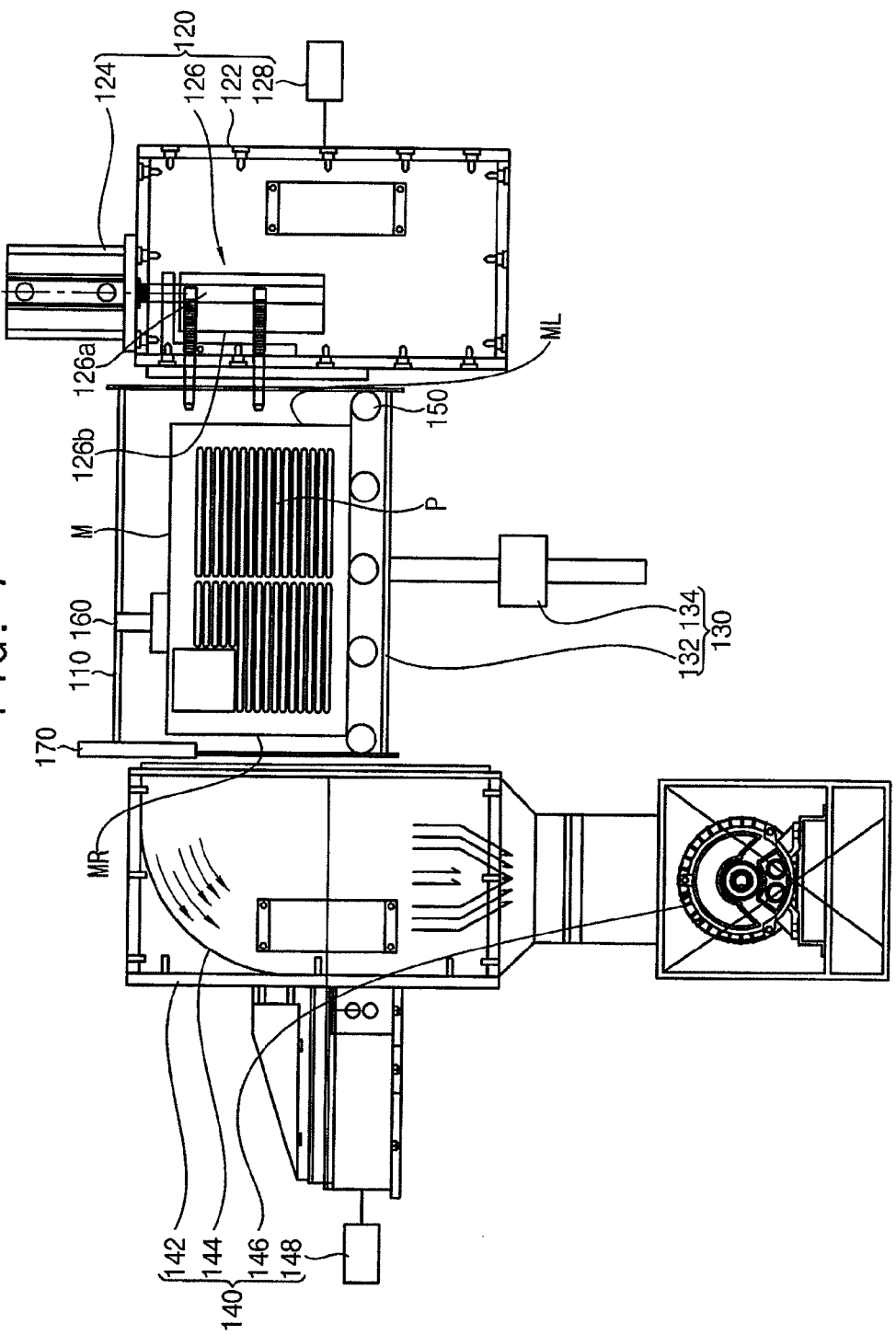

Referring to FIG. 7, the first horizontal actuator 128 may move the air-blowing frame 122 forwardly toward the cleaning chamber 110. The vertical actuator 124 may lower the nozzle assembly 126. The nozzle 126b may be positioned, for example, adjacent to the left side ML of the magazine M.

The second horizontal actuator 148 may move the collecting frame 142 forwardly toward the cleaning chamber 110 to connect the exhausting duct 144 with the left surface of the cleaning chamber 110. The vacuum pump 146 may provide the cleaning chamber 110 with the vacuum through the exhausting duct 144.

The clamp 160 may press the upper surface of the magazine M to firmly fix the magazine M within the cleaning chamber 110. The nozzle 126b may blow the air toward the left side ML of the magazine M to float the particles from the left portions of the semiconductor packages P. The floated particles may be sucked through the exhausting duct 144 by the vacuum.

After removing the particles from the semiconductor packages p by twice air blowing, the magazine M may be unloaded from the cleaning chamber 110 along the conveyor 150.

According to example embodiments, the rotating unit 130 may rotate the semiconductor packages P by, for example, about 180°, so that the air may be blown to the both side surfaces of the semiconductor packages P. Thus, the air may have a proper pressure for preventing the semiconductor packages P from being damaged. As a result, the particles may be effectively removed from the semiconductor packages P without damaging the semiconductor packages P.

Having described example embodiments of the present invention, it is further noted that it is readily apparent to those of reasonable skill in the art that various modifications may be made without departing from the spirit and scope of the invention which is defined by the metes and bounds of the appended claims.

What is claimed is:

1. An apparatus for cleaning at least one object, the apparatus comprising:
    a cleaning chamber configured to receive the at least one object therein;
    an air-blowing unit configured to blow air to the at least one object in the cleaning chamber to float particles from the at least one object;
    a rotating unit configured to rotate the at least one object to provide the at least one object with the air in at least two directions from the air-blowing unit; and
    a collecting unit configured to collect the floated particles, wherein the collecting unit comprises:
    a collecting frame disposed adjacent to the cleaning chamber;
    an exhausting duct installed in the collecting frame and connected to the cleaning chamber;
    a vacuum pump configured to provide the cleaning chamber with a vacuum through the exhausting duct to suck the particles through the exhausting duct; and
    a first horizontal actuator configured to move the collecting frame forwardly and backwardly toward and away from the cleaning chamber.

2. The apparatus of claim 1, wherein the air-blowing unit comprises:
    an air-blowing frame disposed adjacent to the cleaning chamber;
    a nozzle assembly disposed in the air-blowing frame and configured to blow the air to the at least one object; and
    a vertical actuator installed at an upper surface of the air-blowing frame and connected to the nozzle assembly, wherein the vertical actuator is configured to move the nozzle assembly.

3. The apparatus of claim 2, wherein the nozzle assembly comprises:
    a nozzle block fixed to the vertical actuator; and
    a nozzle fixed to the nozzle block and configured to blow the air to the at least one object.

4. The apparatus of claim 3, wherein the nozzle comprises a pair of nozzles disposed vertically in the air-blowing frame.

5. The apparatus of claim 2, wherein the air-blowing unit further comprises a second horizontal actuator configured to move the air-blowing frame forwardly and backwardly toward and away from the cleaning chamber.

6. The apparatus of claim 1, wherein the rotating unit comprises:
    a stage configured to receive the at least one object thereon; and
    a rotary actuator connected with the stage and configured to rotate the stage.

7. The apparatus of claim 6, wherein the rotary actuator is configured to rotate the stage at an angle of about 180° to provide opposing sides of the at least one object with the air.

8. The apparatus of claim 1, further comprising a conveyor configured to load the at least one object into the cleaning chamber.

9. The apparatus of claim 1, further comprising:
    a clamp installed at the cleaning chamber and configured to fix the at least one object within the cleaning chamber; and
    a stopper installed at the cleaning chamber and configured to restrict movement of the at least one object.

10. An apparatus for cleaning semiconductor packages, the apparatus comprising:
    a cleaning chamber configured to receive therein a magazine in which the semiconductor packages are received;
    a conveyor connected to the cleaning chamber and configured to load the magazine into the cleaning chamber;
    a clamp installed at the cleaning chamber and configured to fix the magazine within the cleaning chamber;
    a stopper installed at the cleaning chamber and configured to restrict movement of the magazine;
    an air-blowing unit configured to blow air into the magazine in the cleaning chamber to float particles from the semiconductor packages;
    a rotating unit configured to rotate the magazine to provide opposing sides of each of the semiconductor packages with the air from the air-blowing unit; and
    a collecting unit configured to collect the floated particles, wherein the collecting unit comprises:
    a collecting frame disposed adjacent to the cleaning chamber;
    an exhausting duct installed in the collecting frame and connected to the cleaning chamber;
    a vacuum pump configured to provide the cleaning chamber with a vacuum through the exhausting duct to suck the particles through the exhausting duct; and
    a first horizontal actuator configured to move the collecting frame forwardly and backwardly toward and away from the cleaning chamber.

11. The apparatus of claim 10, wherein the air-blowing unit comprises:
    an air-blowing frame disposed adjacent to the cleaning chamber;
    a nozzle assembly disposed in the air-blowing frame and configured to blow the air into the magazine;
    a vertical actuator installed at an upper surface of the air-blowing frame and connected to the nozzle assembly, wherein the vertical actuator is configured to move the nozzle assembly; and
    a second horizontal actuator configured to move the air-blowing frame forwardly and backwardly toward and away from the cleaning chamber.

12. The apparatus of claim 10, wherein the rotating unit comprises:
    a stage configured to receive the magazine thereon; and
    a rotary actuator connected with the stage and configured to rotate the stage.

13. The apparatus of claim 11, wherein the second horizontal actuator includes a cylinder.

* * * * *